US008040728B2

(12) United States Patent
Taguchi

(10) Patent No.: US 8,040,728 B2
(45) Date of Patent: Oct. 18, 2011

(54) SEMICONDUCTOR INTEGRATED CIRCUIT

(75) Inventor: Kazuo Taguchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 251 days.

(21) Appl. No.: 12/469,181

(22) Filed: May 20, 2009

(65) Prior Publication Data

US 2009/0310417 A1  Dec. 17, 2009

(30) Foreign Application Priority Data

Jun. 12, 2008  (JP) ................................. 2008-153961

(51) Int. Cl.
*G11C 16/04* (2006.01)
*G11C 11/34* (2006.01)

(52) U.S. Cl. .................... 365/185.18; 365/184; 365/149
(58) Field of Classification Search .......... 365/185.01–185.33; 257/37, 309, 314, 315, 324, 257/339
See application file for complete search history.

(56) References Cited

U.S. PATENT DOCUMENTS

| | | | |
|---|---|---|---|
| 4,417,264 A | | 11/1983 | Angle |
| 4,907,198 A | | 3/1990 | Arima |
| 5,049,516 A | | 9/1991 | Arima |
| 5,625,213 A | * | 4/1997 | Hong et al. .................... 257/321 |
| 6,949,790 B2 | | 9/2005 | Iwai et al. |
| 7,307,309 B2 | * | 12/2007 | Hao et al. ...................... 257/317 |
| 7,314,797 B2 | | 1/2008 | Iwai et al. |
| 7,378,706 B2 | * | 5/2008 | Terauchi ...................... 257/324 |

FOREIGN PATENT DOCUMENTS

| | | |
|---|---|---|
| JP | A-59-500343 | 3/1984 |
| JP | A-01-146371 | 6/1989 |
| JP | A-62-502156 | 8/1989 |
| JP | A-06-244431 | 9/1994 |
| JP | A-2000-012709 | 1/2000 |
| JP | A-2002-246485 | 8/2002 |
| JP | A-2003-92368 | 3/2003 |
| WO | WO 86/05323 | 9/1986 |

* cited by examiner

*Primary Examiner* — J. H. Hur
*Assistant Examiner* — Hai Pham
(74) *Attorney, Agent, or Firm* — Oliff & Berridge, PLC

(57) ABSTRACT

A semiconductor integrated circuit includes a non-volatile memory built into the semiconductor integrated circuit, the non-volatile memory electrically writing and erasing data and including a memory cell, the memory cell including: a selecting transistor controlled by a word line; an impurity diffused region formed inside a semiconductor substrate, the impurity diffused region being coupled to one of a source and a drain of the selecting transistor; a first electrode formed above the semiconductor substrate with an insulating film therebetween, the first electrode receiving a control signal and part of the first electrode having an opening; a second electrode formed above the first electrode so as to oppose the first electrode with an insulating film therebetween, the second electrode having a protrusion which opposes the impurity diffused region with a tunnel film therebetween and projects toward the semiconductor substrate through the opening of the first electrode, and storing information based on an applied voltage; and a sensing transistor operating based on charges accumulated in the second electrode, so as to sense the information stored in the memory cell.

5 Claims, 5 Drawing Sheets

SEMICONDUCTOR INTEGRATED CIRCUIT

BACKGROUND

The entire disclosure of Japanese Patent Application No. 2008-153961, filed Jun. 12, 2008 is expressly incorporated by reference herein.

1. Technical Field

The present invention relates to a semiconductor integrated circuit that has a built-in non-volatile memory in which data is electrically writable and erasable.

2. Related Art

Erasable Programmable Read-Only Memory (EPROM) devices are widely used as non-volatile memory devices which allow repeated erasing and writing-in of data. Types of EPROM include Ultra-Violet Erasable Programmable Read Only Memory (UV-EPROM) and Electrically Erasable Programmable Read Only Memory (EEPROM). Memory content of UV-EPROM is erased by ultraviolet light while the memory content of EEPROM is erased electrically. EEPROM is convenient to use due to the above property. However, there is a problem that the physical size of the memory device increases in order to store a large amount of data. Therefore, it is required to reduce the size of the EEPROM memory cell. At the same time, it is required to simplify the manufacturing process of semiconductor integrated circuits with a built-in EEPROM.

FIGS. 6A and 6B are drawings illustrating a structure of an EEPROM memory cell in a semiconductor integrated circuit according to related art. FIG. 6A is a plan view and FIG. 6B is a sectional view of FIG. 6A taken along the line VI-VI. Illustration of an interlayer insulating film is omitted in FIGS. 6A and 6B in order to indicate a positional relationship of conductors.

As shown in FIG. 6B, a p-type semiconductor substrate 110 includes thermal oxide films 111a and 111b, lightly doped n-type impurity diffused region 112, and n-type impurity diffused regions 113a, 113b, 114a, and 114b. Here, the impurity diffused regions 113a and 113b respectively constitute a source/drain of an n-channel MOS transistor Q11 (sensing transistor), and the impurity diffused regions 114a and 114b respectively constitute a source/drain of an n-channel MOS transistor Q12 (selecting transistor).

An upper electrode 132 and a floating gate electrode 131 as a polysilicon underlayer are formed over the semiconductor substrate 110, respectively separated by a gate insulating film 121 and by a tunnel film 122. The upper electrode 132, the tunnel film 122 and the impurity diffused region 112 constitute a capacitor CA. A gate electrode 141 (word line WL) made of a polysilicon layer is formed over the semiconductor substrate 110 with a gate insulating film 123 interposed therebetween.

As shown in FIG. 6A, a lightly doped n-type impurity diffused region 115 is formed in the semiconductor substrate 110. An upper electrode 133 as a polysilicon underlayer is formed over the semiconductor substrate 110 with the interlayer insulating film interposed therebetween. The upper electrode 133, the interlayer insulating film, and the impurity diffused region 115 constitute a capacitor CB.

Moreover, n-type impurity diffused regions 116a and 116b are formed in the semiconductor substrate 110. The n-type impurity diffused region 116a is coupled to the impurity diffused region 115. Here, the impurity diffused regions 116a and 116b respectively constitute a source/drain of an n-channel MOS transistor Q13 (selecting transistor). A word line 141 constitutes a gate electrode of the MOS transistor Q13.

Moreover, wirings 151, 152, and 153 made of an aluminum wiring layer are formed over the semiconductor substrate 110, separated by the interlayer insulating film. The wirings 151, 152, and 153 are respectively electrically coupled to the impurity diffused regions 113a, 114b, and 116b.

In this structure, the capacitors CB and CA are coupled in series between the source/drain of the transistor Q13 (impurity diffused region 116a) and the source/drain of the transistor Q12 (impurity diffused region 114a), and a connection point between the capacitors CB and CA (upper electrodes 132 and 133) is coupled to the floating gate electrode 131 of the transistor Q11.

Applying a high-level selection signal and a prescribed control voltage respectively to the word line 141 and to the serial connection of the capacitors CB and CA via transistors Q13 and Q12 causes the Fowler-Nordheim (FN) tunneling current to flow through the tunnel film 122, and one of positive and negative charges are accumulated in the upper electrodes 132 and 133. Consequently, information is stored in the memory cell. This information is sensed when the transistor Q11 is fixed to one of an on-state and an off-state. This transistor Q11 includes the floating gate electrode 131 coupled to the upper electrodes 132 and 133.

However, in this structure shown in FIGS. 6A and 6B, the memory cell size increases since the capacitors CA and CB are arranged in a planar configuration. Moreover, the process of forming the gate insulating film 121 and the tunnel film 122 needs to be handled separately from the process of forming the gate insulating film 123, thereby complicating the manufacturing process of the semiconductor integrated circuit that includes a built-in EEPROM.

As an example of related art, JP-A-2000-12709 discloses a non-volatile semiconductor memory which operates with reduced voltages for writing-in and erasing. This non-volatile semiconductor memory includes a trench in a semiconductor substrate, and has a higher coupling ratio realized by an expanded area in which the floating gate electrode opposes the control gate electrode. In this non-volatile semiconductor memory, the trench has two different widths. In a narrow trench region, an insulating layer is entirely buried into the trench, and in a wide trench region, the insulating layer is buried inside the trench in a concaved shape. The floating gate electrode is formed on a channel region of an active region with a gate insulating film therebetween, as well as inside the concave of the insulating layer. The control gate electrode is formed on the floating gate electrode across the inside and outside of the concave. However, forming the trench inside the semiconductor substrate complicates the manufacturing process of the non-volatile semiconductor memory.

As another example of related art, JP-A-2002-246485 discloses a non-volatile semiconductor storage device which improves a coupling ratio of a floating gate electrode and a control gate electrode. This non-volatile semiconductor storage device includes: a semiconductor substrate with a main surface; a floating gate electrode including a first conductive film formed on the main surface with a tunnel insulating film therebetween, and a second conductive film deposited on the first conductive film, the second conductive film having a convex (wall); an insulating film formed covering the second conductive film; and a control gate electrode formed on the insulating film. However, forming the floating gate electrode with two conductive films complicates the manufacturing process of the non-volatile semiconductor storage device.

SUMMARY

An advantage of the invention is to reduce a memory cell size of a semiconductor integrated circuit with a built-in non-volatile memory in which data is electrically writable and erasable, without complicating a manufacturing process of the semiconductor integrated circuit.

According to an aspect of the invention, a semiconductor integrated circuit includes a non-volatile memory built into the semiconductor integrated circuit, and this non-volatile memory electrically writes and erases data and includes a memory cell. This memory cell includes: a selecting transistor controlled by a word line; an impurity diffused region formed inside a semiconductor substrate; a first electrode formed above the semiconductor substrate with an insulating film therebetween; a second electrode formed above the first electrode so as to oppose the first electrode with an insulating film therebetween; and a sensing transistor operating based on charges accumulated in the second electrode, so as to sense the information stored in the memory cell. Here, the impurity diffused region is coupled to one of a source and a drain of the selecting transistor. Further, the first electrode receives a control signal and part of the first electrode has an opening. Moreover, the second electrode has a protrusion which opposes the impurity diffused region with a tunnel film therebetween and projects toward the semiconductor substrate through the opening of the first electrode, and stores information based on an applied voltage.

In this case, an oxidation film may be formed facing the first electrode, in a region at a main surface of the semiconductor substrate, so that the region in which the oxidation film is formed surrounds a periphery of a region in which the impurity diffused region is formed. This increases a breakdown voltage between the first electrode and the semiconductor substrate. Moreover, a capacitance formed between the second electrode and the first electrode is increased if an insulating film between the second electrode and the first electrode includes a high-dielectric nitride film. Further, the sensing transistor may include any one of a floating gate electrode electrically coupled to the second electrode and a floating gate electrode integrated with the second electrode. The latter floating gate electrode allows for further decreasing the size of the memory cell.

According to the aspect of the invention, the memory cell includes the first capacitor and the second capacitor, and the first capacitor has the first electrode formed on the semiconductor substrate with the insulating film therebetween and the second electrode formed on the first electrode with the insulating film therebetween. The second capacitor has the protrusion projecting toward the semiconductor substrate through the opening provided in the first electrode, and the impurity diffused region which opposes the protrusion with the tunnel film therebetween. Therefore, a capacitance higher than that of the second capacitor may be easily provided to the first capacitor, and thus the memory cell size is reduced without complicating the manufacturing process of the semiconductor integrated circuit.

DESCRIPTION OF EXEMPLARY EMBODIMENTS

Figure 1A:
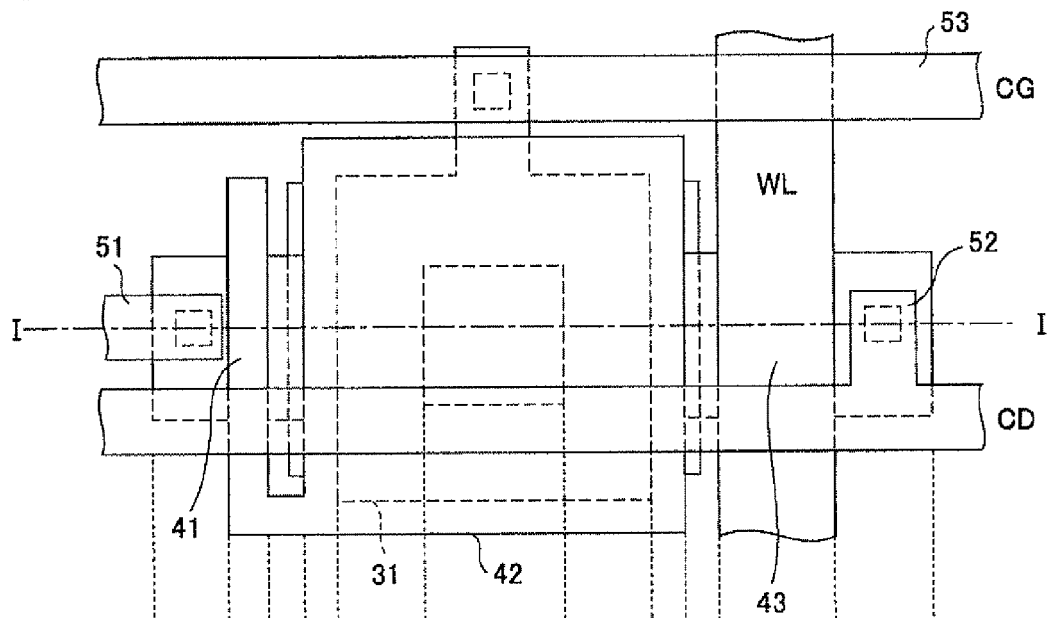
FIGS. 1A and 1B are drawings illustrating a structure of an EEPROM memory cell according to a first embodiment of the invention.

An embodiment of the invention will now be described in detail with references to the drawings. Like reference numerals designate like elements, omitting the description thereof.

Figure 1B:
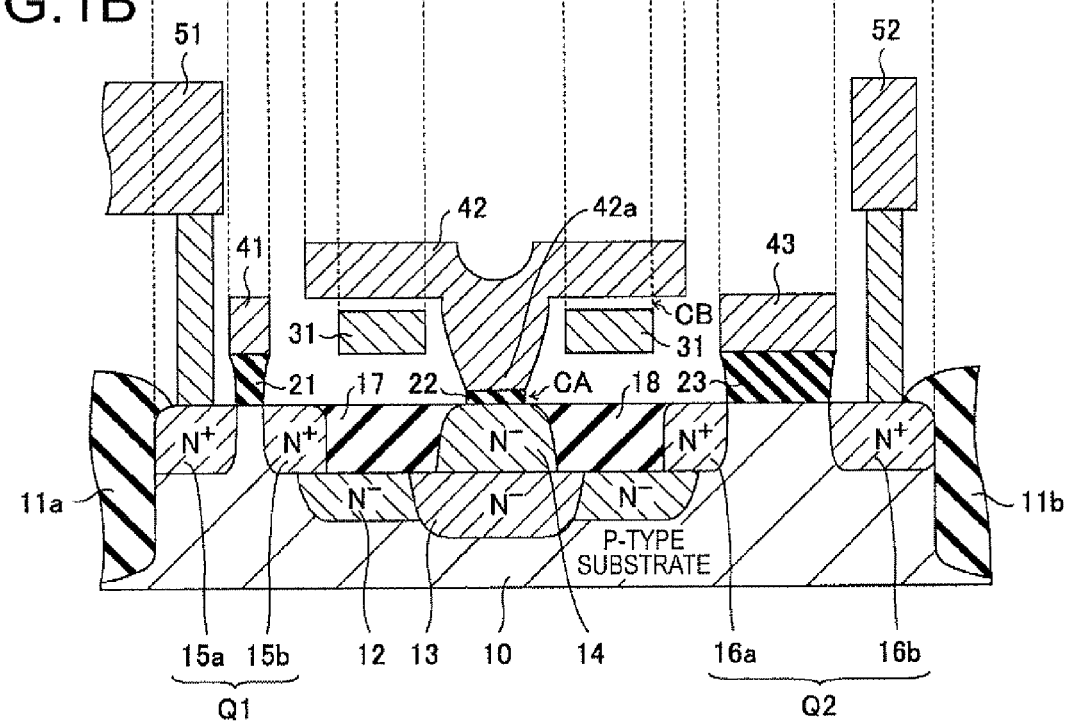

FIGS. 1A and 1B are drawings illustrating a structure of an EEPROM memory cell built into a semiconductor integrated circuit according to a first embodiment of the invention. FIG. 1A is a plan view and FIG. 1B is a sectional view of FIG. 1A taken along the line I-I. Illustration of an interlayer insulating film is omitted in FIGS. 1A and 1B in order to indicate a positional relationship of conductors.

As shown in FIG. 1B, a p-type semiconductor substrate 10 includes thermal oxide films 11a and 11b, lightly doped n-type impurity diffused regions 12 to 14, and n-type impurity diffused regions 15a, 15b, 16a, and 16b. In this embodiment, the semiconductor substrate 10 is a silicon substrate. Here, the impurity diffused regions 15a and 15b respectively constitute a source/drain of an n-channel MOS transistor Q1 (sensing transistor), and the impurity diffused regions 16a and 16b respectively constitute a source/drain of an n-channel MOS transistor Q2 (selecting transistor).

In this embodiment, silicon oxide films 17 and 18 are formed around the lightly doped n-type impurity diffused region 14 either by local oxidation of silicon (LOCOS) or shallow trench isolation (STI), so as to isolate the impurity diffused region 14 as an island. The silicon oxide films 17 and 18 cover a region in the semiconductor substrate 10 that opposes a first electrode 31. This improves a breakdown voltage between the first electrode 31 and the semiconductor substrate 10.

The first electrode 31 as a polysilicon underlayer is formed over the semiconductor substrate 10 with an interlayer insulating film interposed therebetween. As shown in FIG. 1A, an opening is formed in part (center) of the first electrode 31. A floating gate electrode 41, a second electrode 42, and a gate electrode 43 (word line WL) which are made of polysilicon are formed, separated by an insulating film. The floating gate electrode 41 is formed over the semiconductor substrate 10 with a gate insulating film 21 therebetween. The second electrode 42 is formed over the first electrode 31 with the interlayer insulating film therebetween. The gate electrode 43 is formed over the semiconductor substrate 10 with a gate insulating film 23 therebetween.

The second electrode 42 opposes the first electrode 31 with the interlayer insulating film interposed therebetween. The second electrode 42, the interlayer insulating film, and the first electrode 31 constitute the capacitor CB having a polysilicon-insulator-polysilicon (PIP) structure. The second electrode 42 includes a protrusion 42a which projects toward the semiconductor substrate 10 through the opening formed in the first electrode 31. The protrusion 42a opposes the impurity diffused region 14 with a tunnel film 22 interposed therebetween. The second electrode 42, the tunnel film 22, and the impurity diffused region 14 constitute the capacitor CA.

The tunnel film 22 is formed during a first gate-oxidation in which gate insulating films for transistors in a low-voltage system are formed. The gate insulating films 21 and 23 are formed during a second gate-oxidation in which gate insulating films for transistors in a high-voltage system are formed. Here, an oxidation film is added on the existing oxidation films formed by the first gate oxidation. The suitable film thickness of the tunnel film 22 is approximately between 70 to 120 Å. A film thickness of a silicon oxidation film is managed in high accuracy and therefore the silicon oxidation film may be used as the gate insulating films for transistors in the low-voltage system. Similarly, the silicon oxidation film may be used as the tunnel film 22. This allows for stabilizing the memory cell quality. Consequently, there is no need to handle a special thermal oxidation process for forming the tunnel film separately from forming the gate insulating films, thereby simplifying the manufacturing process of a semiconductor integrated circuit.

As shown in FIG. 1A, wirings 51, 52, and 53 made of an aluminum wiring layer are formed over the semiconductor substrate 10, separated by the interlayer insulating film. The wirings 51, 52, and 53 are respectively electrically coupled to the n-type impurity diffused regions 15a and 15b, and the first electrode 31. A control signal CD is supplied to the wiring 52, and a control signal CG is supplied to the wiring 53.

Here, the capacitor CB and the capacitor CA are coupled in series between the wiring 53 and the source/drain of the transistor Q2 (impurity diffused region 16a), and a connection point (second electrode 42) between the capacitors CA and CB is coupled to the floating gate electrode 41 of the transistor Q1.

Applying a voltage not less than a prescribed voltage to the capacitor CA causes the FN tunneling current to flow between the impurity diffused region 14 and the protrusion 42a of the second electrode 42, through the tunnel film 22. This allows the second electrode 42 to store information based on the applied voltage. The floating gate electrode 41 of the transistor Q1 has the same potential as that of the second electrode 42. Thus the transistor Q1 operates based on charges accumulated in the second electrode 42, thereby sensing the information stored in the memory cell.

The voltage applied to a serial connection of the capacitors CA and CB is divided in accordance with a capacity ratio (coupling ratio) of the capacitors CA and CB. Thus, it is desirable that the capacity of the capacitor CB be larger than that of the capacitor CA, in order to reduce a voltage necessary for the FN tunneling current to flow through the tunnel film 22. Desirably, the capacity of the capacitor CB should be 4 times or more than that of the capacitor CA.

In this embodiment, arranging the capacitor CA and the capacitor CB in three dimensions allows for reducing the size of the memory cell. Moreover, forming the tunnel film 22 during the process of forming the gate insulating films 21 and 23 avoids complicating the manufacturing process of the semiconductor integrated circuit with a built-in EEPROM.

Figure 2:
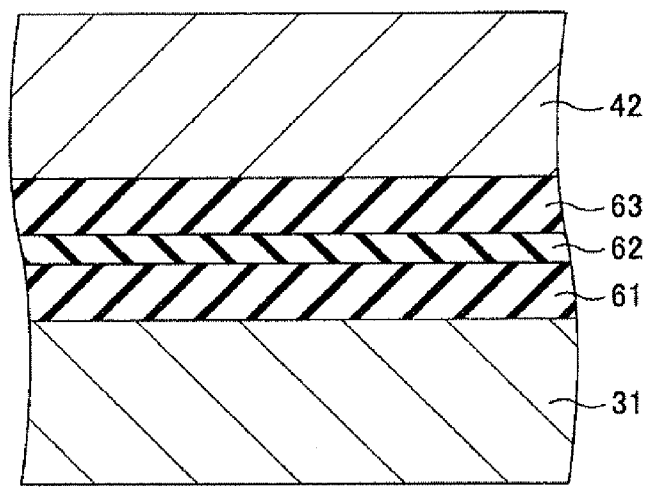
FIG. 2 is a drawing illustrating an example of forming an oxide-nitride-oxide film between a first electrode and a second electrode.

The protrusion 42a formed on the second electrode 42 of the capacitor CB increases the area in which the second electrode 42 opposes the first electrode 31, thereby increasing the capacitance. High-dielectric materials may be used for the insulating film formed between the first electrode 31 and the second electrode 42, in order to further increase the capacitance of the capacitor CB. Examples of films made of such high-dielectric materials include high-dielectric nitride film (silicon nitride film: SixOy, where x and y are arbitrary numbers) and ONO film (three-layer structure of oxide-nitride-oxide film). FIG. 2 is a drawing illustrating an example of forming an oxide-nitride-oxide film between a first electrode and a second electrode. As shown in FIG. 2, a silicon oxide film 61, a silicon nitride film 62, and a silicon oxide film 63 are formed between the first electrode 31 and the second electrode 42.

The presence of parasitic capacitance between the second electrode 42 and the semiconductor substrate 10 increases the capacitance of the capacitor CA. In this embodiment, however, forming the second electrode 42 in a layer above the first electrode 31 causes the parasitic capacitance between the second electrode 42 and the semiconductor substrate 10 to be significantly small. This reduces the capacitance of the capacitor CA. The parasitic capacitance between the first electrode 31 and the semiconductor substrate 10 does not effect the operation of the memory cell, as long as the breakdown voltage is secured during data write-in. The impurity diffused region 14 is an island-shaped silicon as shown in FIG. 1B, and therefore the capacitance of the capacitor CA is reduced by displacing the arrangement of the impurity diffused region 14 and the second electrode 42.

The operation of the memory cell shown in FIGS. 1A and 1B will now be described.

Figure 3:
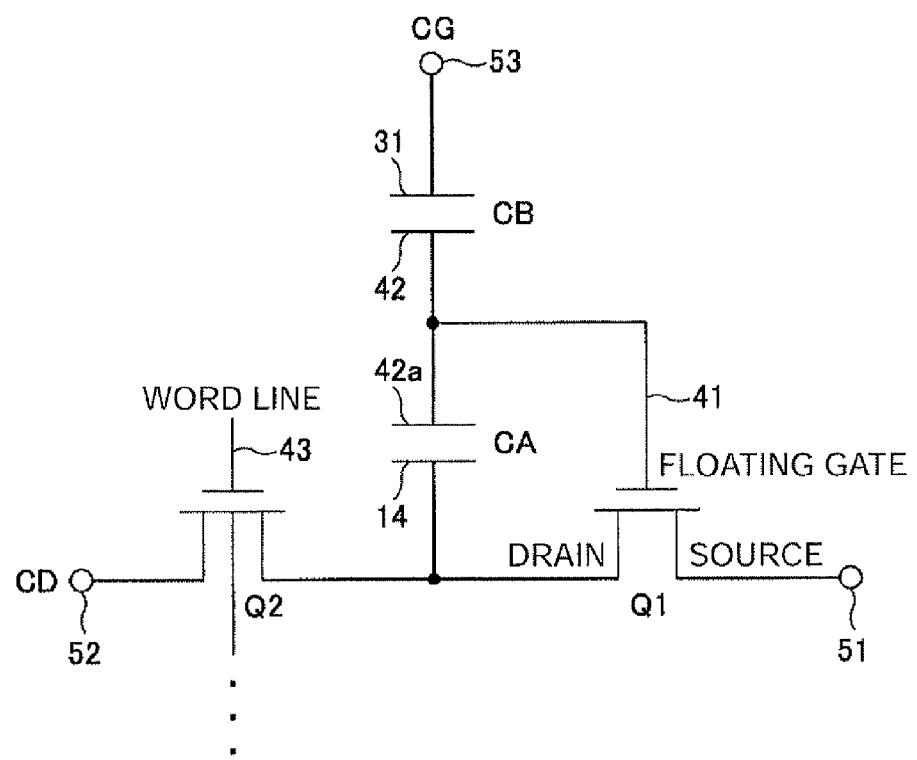
FIG. 3 is a circuit diagram of a memory cell illustrated in FIGS. 1A and 1B.

FIG. 3 is a circuit diagram of the memory cell illustrated in FIGS. 1A and 1B. The source of the transistor Q1 (sensing transistor) is in an open state during the data write-in. In order to select the memory cell, a prescribed high potential $V_D$ is applied to the word line which is the gate electrode of the transistor Q2 (selecting transistor).

During the write-in operation of data "1" into the memory cell, the high potential $V_D$ is applied to the wiring 53 as the control signal CG, and a ground potential (0V) is applied to the wiring 52 as the control signal CD. The voltage $V_D$ applied to the serial connection of the capacitors CA and CB is divided in accordance with the capacity ratio (coupling ratio) of the capacitors CA and CB, and the divided voltage is applied to both ends of the capacitor CA. This causes the FN tunneling current to flow from the protrusion 42a to the impurity diffused region 14 in the capacitor CA, and therefore negative charges are accumulated in the second electrode 42 which has the protrusion 42a, thereby writing the data "1" into the memory cell. At this time, the previously written data is deleted. During the read-out operation of the data, the source of the transistor Q1 is grounded and the transistor Q1 is fixed to an off state, thereby reading out the data "1".

During the write-in operation of data "0" into the memory cell, the ground potential (0V) is applied to the wiring 53 as the control signal CG, and the high potential $V_D$ is applied to the wiring 52 as the control signal CD. Therefore, if a threshold voltage of the transistor Q2 is $V_T$, then a voltage "$-(V_D-V_T)$" which is applied to the serial connection of the capacitors CA and CB is divided in accordance with the capacity ratio (coupling ratio) of the capacitors CA and CB, and the divided voltage is applied to both ends of the capacitor CA. This causes the FN tunneling current to flow from the impurity diffused region 14 to the protrusion 42a in the capacitor CA, and therefore positive charges are accumulated in the second electrode 42 which has the protrusion 42a, thereby writing the data "0" into the memory cell. At this time, the previously written data is deleted. During the read-out operation of data, the source of the transistor Q1 is grounded and the transistor Q1 is fixed to an on state, thereby reading out the data "0".

If the memory cell is not selected during the data write-in, the ground potential (0V) is applied to the word line. In this case, the transistor Q2 switches to an off state and the FN tunneling current does not flow into the capacitor CA even if a voltage is applied between the wirings 52 and 53. Thus the data stored in the memory cell does not change.

A second embodiment of the present invention will now be described.

Figure 4A:
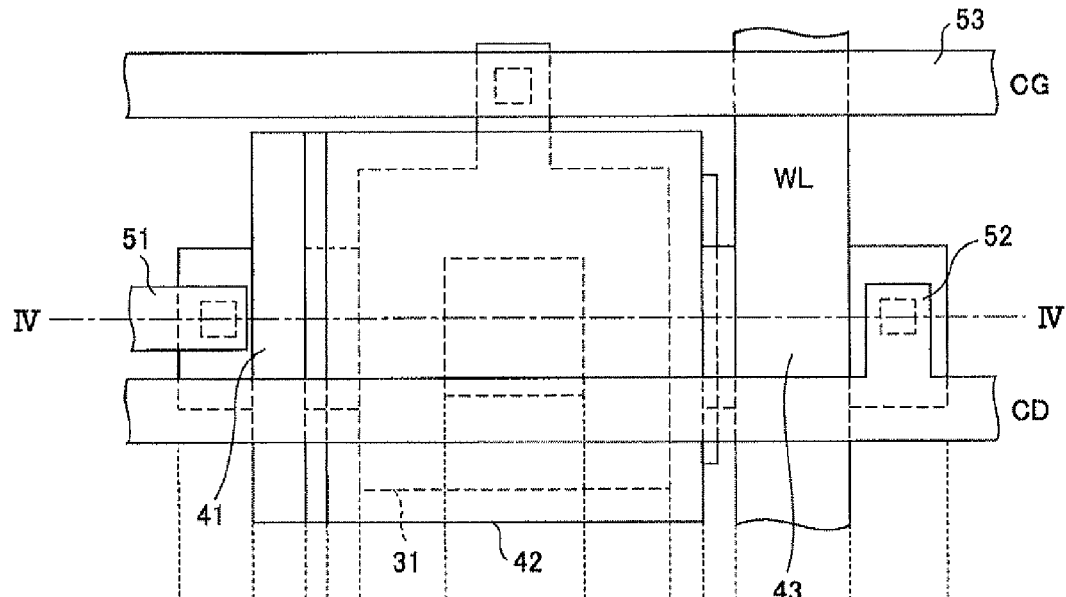
FIGS. 4A and 4B are drawings illustrating a structure of an EEPROM memory cell according to a second embodiment of the invention.
Figure 4B:
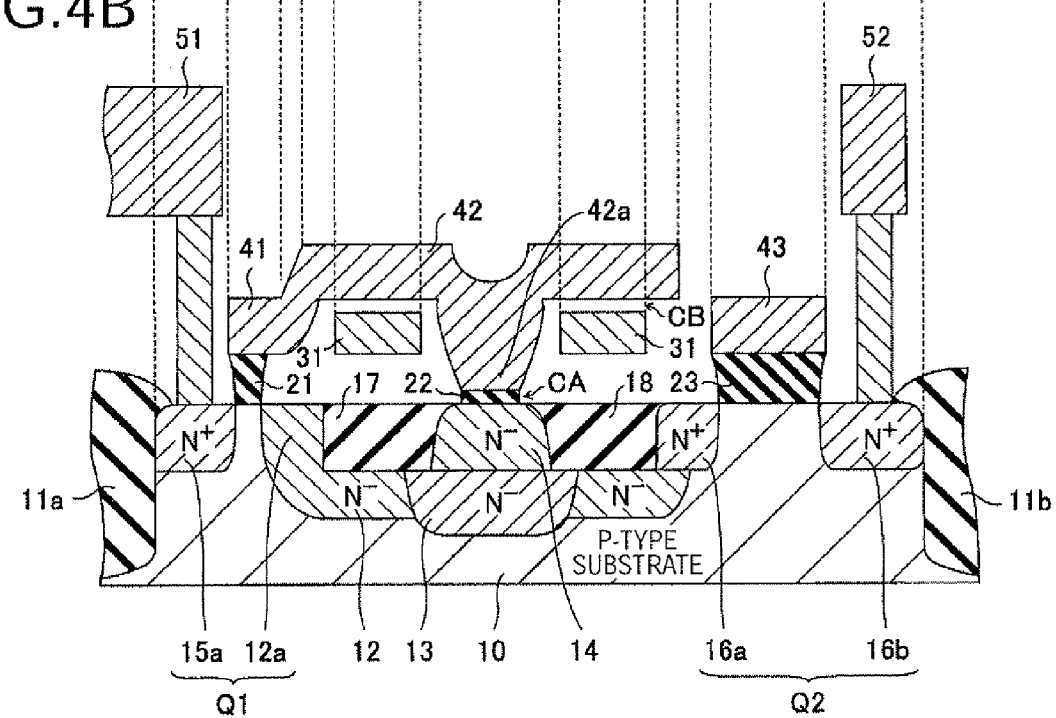

FIGS. 4A and 4B are drawings illustrating a structure of an EEPROM memory cell built into a semiconductor integrated circuit according to the second embodiment of the invention. FIG. 4A is a plan view and FIG. 4B is a sectional view of FIG. 4A taken along the line IV-IV. Illustration of an interlayer insulating film is omitted in FIGS. 4A and 4B in order to indicate a positional relationship of conductors.

In the second embodiment, the floating gate electrode 41 of the transistor Q1 (sensing transistor) is integrated into the second electrode 42. Here, the impurity diffused region 15b shown in FIG. 1B is alternated with an extension 12a of the lightly doped impurity diffused region 12, thereby serving as the drain of the transistor Q1. Other structures are the same as that of the first embodiment.

A third embodiment of the present invention will now be described.

Figure 5A:
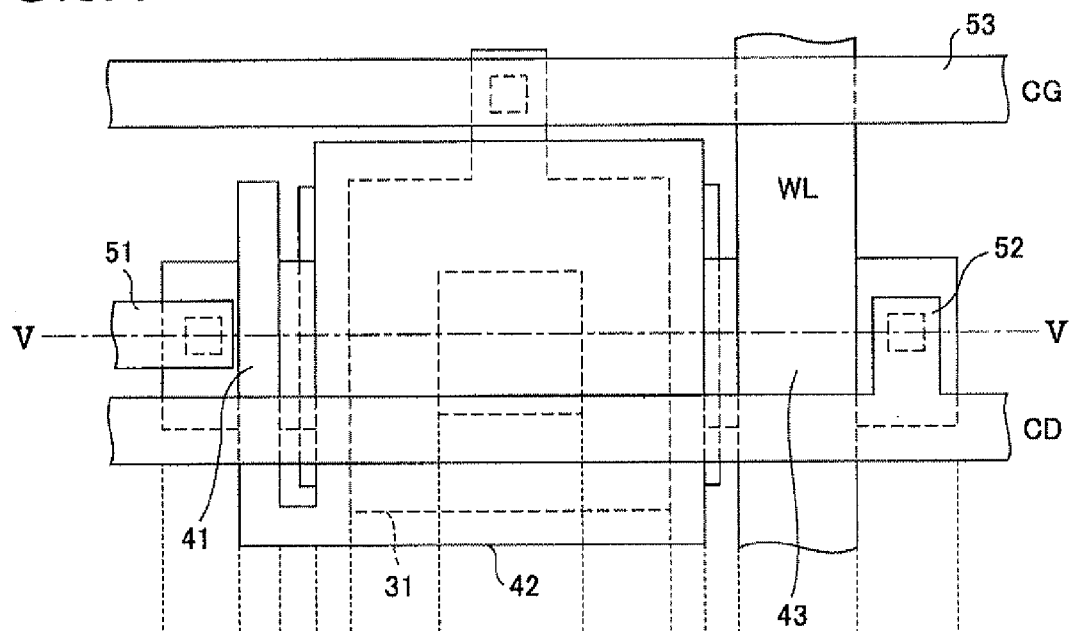
FIGS. 5A and 5B are drawings illustrating a structure of an EEPROM memory cell according to a third embodiment of the invention.
Figure 5B:
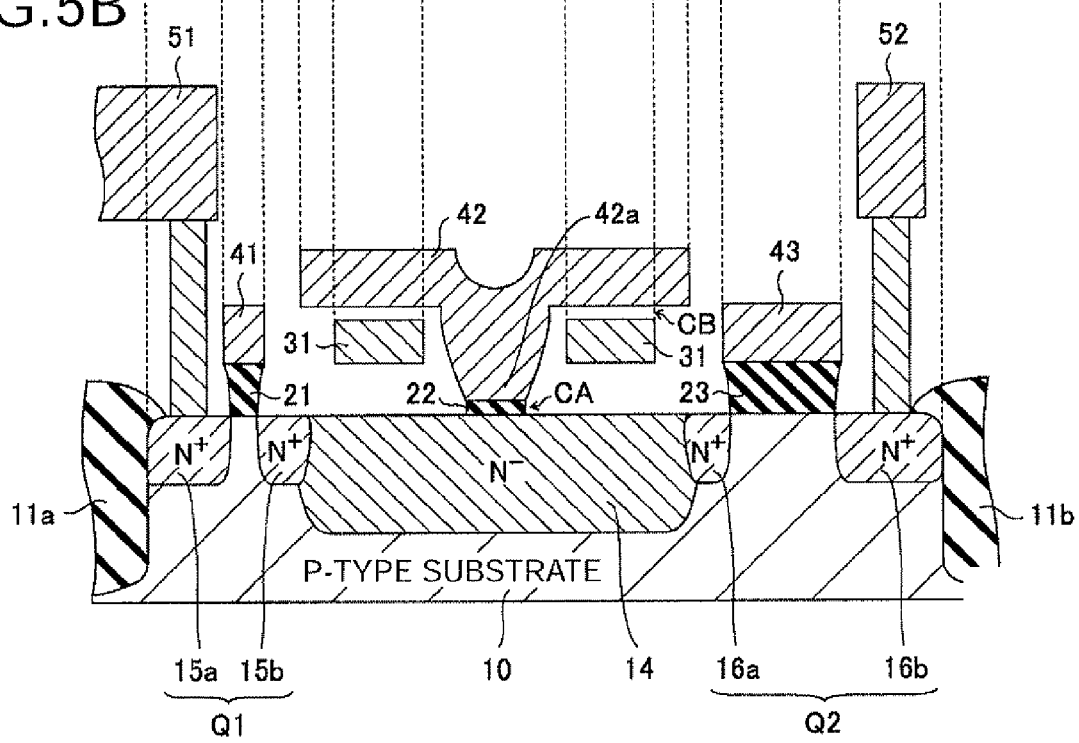
Figure 6A:
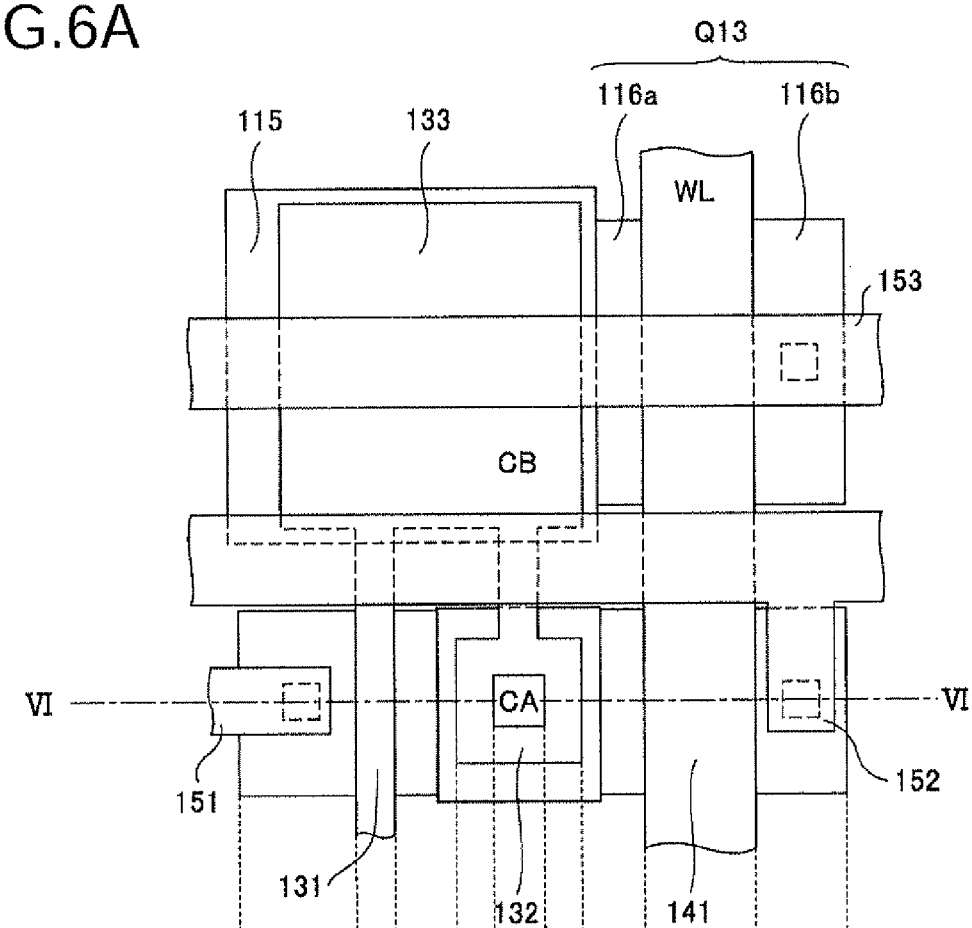
FIGS. 6A and 6B are drawings illustrating a structure of an EEPROM memory cell of a semiconductor integrated circuit according to related art.
Figure 6B:
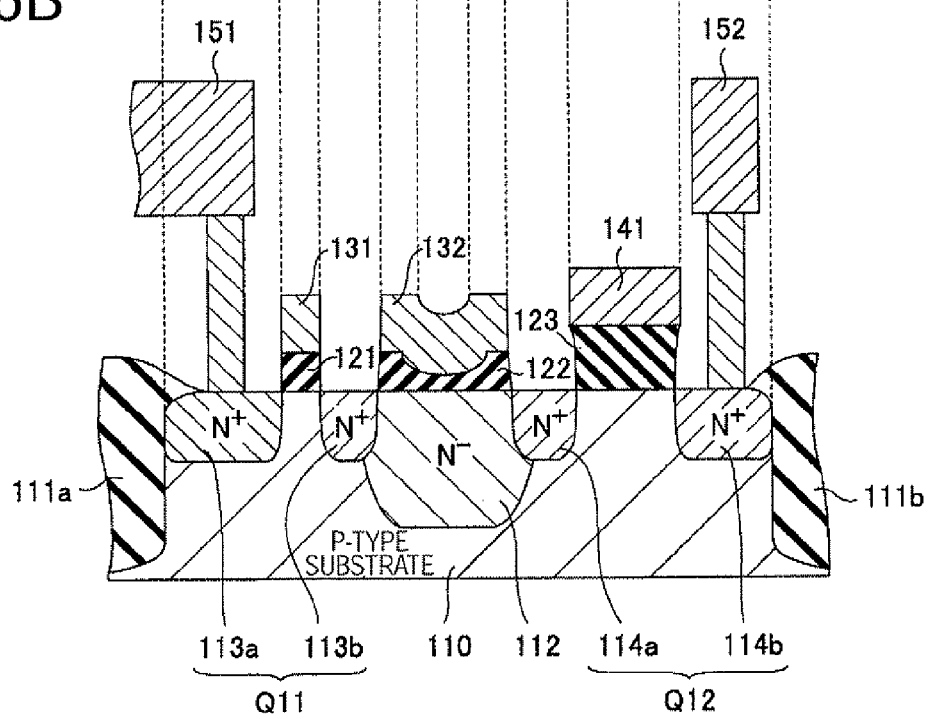

FIGS. 5A and 5B are drawings illustrating a structure of an EEPROM memory cell built into a semiconductor integrated circuit according to the third embodiment of the invention. FIG. 5A is a plan view and FIG. 5B is a sectional view of FIG. 5A taken along the line V-V. Illustration of an interlayer insulating film is omitted in FIGS. 5A and 5B in order to indicate a positional relationship of conductors.

The third embodiment does not include the silicon oxide films 17 and 18 shown in FIGS. 1A and 1B in the first embodiment. Alternatively, the lightly doped impurity diffused region 14 is widely formed in a region including the surface of the semiconductor substrate 10. This simplifies the structure of the semiconductor integrated circuit, while the film thickness of the interlayer insulating film needs to be determined in consideration of the breakdown voltage between the first electrode 31 and the impurity diffused region 14.

In the above embodiments, n-channel MOS transistors are formed in a p-type semiconductor substrate, while p-channel MOS transistors may be formed in any one of an n-well and an n-type semiconductor substrate.

What is claimed is:

1. A semiconductor integrated circuit, comprising:
a non-volatile memory built into the semiconductor integrated circuit, the non-volatile memory electrically writing and erasing data and including a memory cell, the memory cell including:
 a selecting transistor controlled by a word line;
 an impurity diffused region formed inside a semiconductor substrate, the impurity diffused region being coupled to one of a source and a drain of the selecting transistor;
 a first electrode formed above the semiconductor substrate with an insulating film therebetween, the first electrode receiving a control signal and part of the first electrode having an opening;
 a second electrode formed above the first electrode so as to oppose the first electrode with an insulating film therebetween, the second electrode having a protrusion which opposes the impurity diffused region with a tunnel film therebetween and projects toward the semiconductor substrate through the opening of the first electrode, and storing information based on an applied voltage; and
 a sensing transistor operating based on charges accumulated in the second electrode, so as to sense the information stored in the memory cell, wherein
 the entire first electrode is sandwiched between the second electrode and the semiconductor substrate in cross-section view.

2. The semiconductor integrated circuit according to claim 1, wherein an oxidation film is formed opposing the first electrode, in a region at a main surface of the semiconductor substrate, so that the region in which the oxidation film is formed surrounds a periphery of a region in which the impurity diffused region is formed.

3. The semiconductor integrated circuit according to claim 1, wherein an insulating film between the second electrode and the first electrode includes a nitride film.

4. The semiconductor integrated circuit according to claim 1, wherein the sensing transistor includes a floating gate electrode electrically coupled to the second electrode.

5. The semiconductor integrated circuit according to claim 1, wherein the sensing transistor includes a floating gate electrode integrated with the second electrode.

* * * * *